US010074757B2

United States Patent
Hokari

(10) Patent No.: US 10,074,757 B2
(45) Date of Patent: Sep. 11, 2018

(54) SEMICONDUCTOR PACKAGE, SENSOR MODULE, AND PRODUCTION METHOD

(71) Applicant: SONY CORPORATION, Tokyo (JP)

(72) Inventor: Sumio Hokari, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/513,295

(22) PCT Filed: Sep. 17, 2015

(86) PCT No.: PCT/JP2015/076411
§ 371 (c)(1),
(2) Date: Mar. 22, 2017

(87) PCT Pub. No.: WO2016/052217
PCT Pub. Date: Apr. 7, 2016

(65) Prior Publication Data
US 2017/0309756 A1    Oct. 26, 2017

(30) Foreign Application Priority Data

Sep. 29, 2014 (JP) ................................. 2014-198868

(51) Int. Cl.
*H01L 31/024*    (2014.01)
*H01L 27/146*    (2006.01)
(Continued)

(52) U.S. Cl.
CPC ...... *H01L 31/024* (2013.01); *H01L 27/14618* (2013.01); *H01L 27/14627* (2013.01);
(Continued)

(58) Field of Classification Search
CPC ......... H01L 31/03926; H01L 27/14636; H01L 27/14618; H01L 31/024
See application file for complete search history.

(56) References Cited

U.S. PATENT DOCUMENTS

2014/0055669 A1*  2/2014  Chen ................ H01L 27/14618
                                                            348/374

FOREIGN PATENT DOCUMENTS

JP    2003-332549 A    11/2003
JP    2006-080667 A     3/2006
(Continued)

OTHER PUBLICATIONS

Machine Translation of JP-2003-332549.*
(Continued)

*Primary Examiner* — Julia Slutsker
(74) *Attorney, Agent, or Firm* — Sheridan Ross P.C.

(57) ABSTRACT

The present disclosure relates to a semiconductor package, a sensor module, and a production method for dissipating heat generated by a chip. In a solid-state image sensing element package, an image sensing element chip is bonded and fixed to a heat dissipation plate with a die bond material, the heat dissipation plate having positioning holes and mounting holes for accurately mounting on a lens barrel unit. A circuit board is bonded to a bottom surface of the heat dissipation plate with circuit board adhesive resin. Bonding pads that are electrodes of the image sensing element chip are electrically connected to lead terminals that are electrodes of the circuit board by conduction wires through conduction wire connection clearance holes formed through the heat dissipation plate. The present disclosure is applicable to a CMOS solid-state image sensing apparatus used for an image sensing apparatus such as a camera, for example.

16 Claims, 9 Drawing Sheets

(51) Int. Cl.
*H01L 31/0392* (2006.01)
*H04N 5/378* (2011.01)
(52) U.S. Cl.
CPC .. *H01L 27/14636* (2013.01); *H01L 27/14683* (2013.01); *H01L 31/03926* (2013.01); *H04N 5/378* (2013.01)

(56) References Cited

FOREIGN PATENT DOCUMENTS

JP    2008-227653 A    9/2008
JP    2009-147685 A    7/2009

OTHER PUBLICATIONS

Machine Translation of JP-2006-080667.*
International Search Report prepared by the Japan Patent Office on Nov. 19, 2015, for International Application No. PCT/JP2015/076411.

* cited by examiner

SEMICONDUCTOR PACKAGE, SENSOR MODULE, AND PRODUCTION METHOD

CROSS REFERENCE TO RELATED APPLICATIONS

This application is a national stage application under 35 U.S.C. 371 and claims the benefit of PCT Application No. PCT/JP2015/076411 having an international filing date of 17 Sep. 2015, which designated the United States, which PCT application claimed the benefit of Japanese Patent Application No. 2014-198868 filed 29 Sep. 2014, the disclosures of which are incorporated herein by reference in their entirety.

TECHNICAL FIELD

The present disclosure relates to a semiconductor package, a sensor module, and a production method, and more particularly to a semiconductor package, a sensor module, and a production method for dissipating heat generated by a chip effectively.

BACKGROUND ART

Electronic devices each including a built-in solid-state image sensing element package, in which an image sensing element chip such as CCD (Charge Coupled Device) and CMOS (Complementary Metal Oxide Semiconductor) image sensors is housed in ceramics or the like, such as digital cameras, video cameras, and mobile phones are widely used.

In a case that an electronic device including a solid-state image sensing element package captures an image, an image sensing element chip generates heat, and thereby the electric properties may be degraded and the image quality may be degraded. Therefore, it is desirable to provide a solid-state image sensing element package having high heat dissipation properties.

Patent Literature 1discloses a package structure including a metal plate and a frame that effectively dissipate heat generated by an image sensing element from the metal plate to a camera lens housing and the like.

CITATION LIST

Patent Literature

Patent Literature 1: Japanese Patent Application Laid-open No. 2013-222772

DISCLOSURE OF INVENTION

Technical Problem

However, in recent years, the number of pixels and the processing speed of a solid-state image sensing element are increased, and the amount of heat generated by an image sensing element chip is also increased. Therefore, it is desirable to provide a more effective heat dissipation structure.

The present disclosure is made in view of the above-mentioned circumstances, and heat generated by a chip is effectively dissipated according to the present disclosure.

Solution to Problem

A semiconductor package according to an aspect of the present technology includes a heat dissipation plate, a semiconductor element chip bonded to a top surface of the heat dissipation plate, and a circuit board arranged on a bottom surface of the heat dissipation plate, an electrode of the semiconductor element chip being connected to an electrode of the circuit board by a conduction wire through a hole formed through the heat dissipation plate.

A mounting hole for mounting on a configuration unit that configures a semiconductor apparatus and a positioning hole for determining a position on the configuration unit are formed through the heat dissipation plate.

The semiconductor element chip is a solid-state image sensing element chip, and the configuration unit is a configuration unit that configures an image sensing apparatus.

The configuration unit is a lens barrel unit.

The circuit board is an organic board or a flexible board each having low stiffness.

The circuit board is bonded to the bottom surface of the heat dissipation plate.

The heat dissipation plate is metal.

A sensor module according to an aspect of the present technology includes a heat dissipation plate, a semiconductor element chip bonded to a top surface of the heat dissipation plate, and a circuit board arranged on a bottom surface of the heat dissipation plate, an electrode of the semiconductor element chip being connected to an electrode of the circuit board by a conduction wire through a hole formed through the heat dissipation plate.

A mounting hole for mounting on a configuration unit that configures a semiconductor apparatus and a positioning hole for determining a position on the configuration unit are formed through the heat dissipation plate.

The semiconductor element chip is a solid-state image sensing element chip, and the configuration unit is a configuration unit that configures an image sensing apparatus.

The configuration unit is a lens barrel unit.

The circuit board is an organic board or a flexible board each having low stiffness.

The circuit board is bonded to the bottom surface of the heat dissipation plate.

The heat dissipation plate is metal.

A production method according to an aspect of the present technology includes arranging a circuit board on a bottom surface of a heat dissipation plate, bonding a semiconductor element to a top surface of the heat dissipation plate, and connecting an electrode of a chip of the semiconductor element to an electrode of the circuit board by a conduction wire through a hole formed through the heat dissipation plate.

According to an aspect of the present technology, a circuit board is arranged on a bottom surface of a heat dissipation plate, and a semiconductor element is bonded to a top surface of the heat dissipation plate. Then, an electrode of a chip of the semiconductor element is connected to an electrode of the circuit board by a conduction wire through a hole formed through the heat dissipation plate.

Advantageous Effects of Invention

According to the present technology, heat can be dissipated. In particular, according to the present technology, heat can be effectively dissipated.

It should be noted that the effects described in the present specification are merely illustrative, and the effects of the present technology are not limited to the effects described in the present specification and may have additive effects.

MODES FOR CARRYING OUT THE INVENTION

Hereinafter, modes for carrying out the present disclosure (embodiments) will be described.

<Schematic Configuration Example of Solid-state Image Sensing Apparatus>

Figure 1:
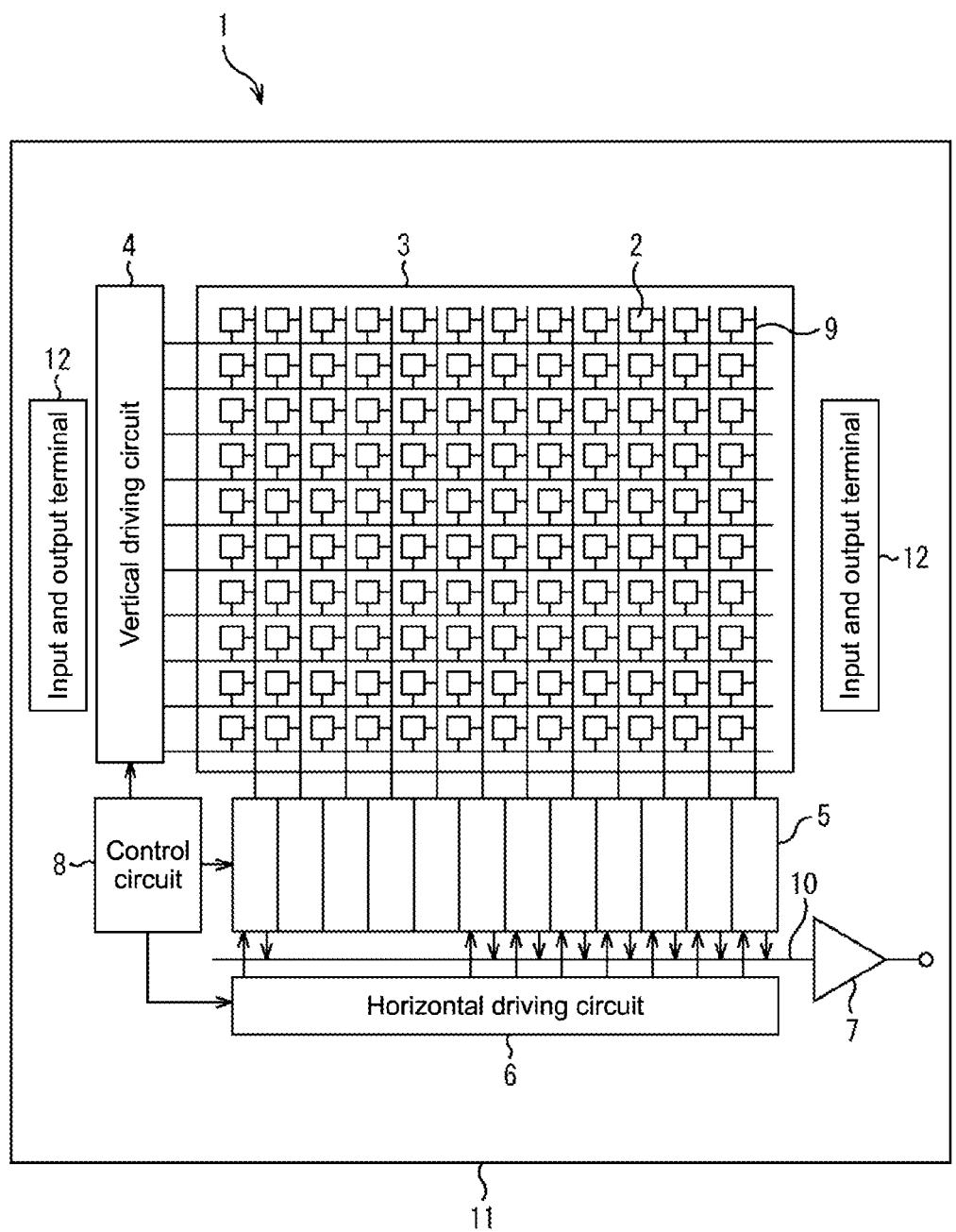
FIG. 1 is a block diagram showing a schematic configuration example of a solid-state image sensing element to which the present technology is applied.

FIG. 1 shows a schematic configuration example of an illustrative CMOS (Complementary Metal Oxide Semiconductor) solid-state image sensing element applied to each embodiment of the present technology.

As shown in FIG. 1, a solid-state image sensing element (image sensing element chip) 1 includes a pixel area (so-called image sensing area) 3 where pixels 2 including a plurality of photoelectric conversion elements are regularly and two-dimensionally arrayed on a semiconductor substrate 11 (e.g., silicon substrate), and a peripheral circuit part.

The pixel 2 includes a photoelectric conversion element (e.g., photodiode) and a plurality of pixel transistors (so-called MOS transistors). For example, the plurality of the transistors may include three transistors: a transfer transistor, a reset transistor, and an amplification transistor, or may include four transistors: the above-described transistors and a selection transistor. An equivalent circuit of each pixel 2 (unit pixel) is similar to the general one, and a detailed description is therefore omitted here.

Also, the pixel 2 may have a pixel shared structure. The pixel shared structure includes a plurality of photodiodes, a plurality of transfer transistors, one floating diffusion shared, and each one of other transistors shared. The photodiode is a photoelectric conversion element.

The peripheral circuit part includes a vertical driving circuit 4, column signal processing circuits 5, a horizontal driving circuit 6, an output circuit 7, and a control circuit 8.

The control circuit 8 receives data that instructs an input clock, an operation mode, or the like, and outputs data about internal information of the image sensing element chip 1. Specifically, the control circuit 8 generates a clock signal and a control signal as a reference for the operations of the vertical driving circuit 4, the column signal processing circuits 5, and the horizontal driving circuit 6 on the basis of a vertical synchronization signal, a horizontal synchronization signal, and a master clock. Then, the control circuit 8 inputs these signals to the vertical driving circuit 4, the column signal processing circuits 5, and the horizontal driving circuit 6.

For example, the vertical driving circuit 4 includes shift resistors, selects a pixel driving wiring, supplies a pulse for driving the pixels 2 to the selected pixel driving wiring, and drives each row of the pixels 2. Specifically, the vertical driving circuit 4 selectively scans each row of the respective pixels 2 in a pixel area 3 sequentially in a vertical direction, and supplies pixel signals to the column signal processing circuits 5 through vertical signal lines 9, the pixel signal being based on a signal charge generated by the photoelectric conversion elements of the respective pixels 2 corresponding to the amount of the received light.

Each column signal processing circuit 5 is arranged, for example, for each column of the pixels 2, and performs signal processing such as denoising for a signal output from the pixels 2 of one row for each pixel column. Specifically, the column signal processing circuits 5 perform the signal processing such as CDS (Correlated Double Sampling) for removing a fixed pattern noise specific to the pixels 2, signal amplification, and A/D (Analog/Digital) conversion. A horizontal selection switch (not shown) is provided on an output stage of the column signal processing circuits 5, and is connected to a horizontal signal line 10.

For example, the horizontal driving circuit 6 includes shift resistors, sequentially outputs a horizontal scanning pulse, selects each of the column signal processing circuits 5 in order, and allows each of the column signal processing circuits 5 to output a pixel signal to the horizontal signal line 10.

The output circuit 7 processes the signal sequentially supplied from each of the column signal processing circuits 5 through the horizontal signal line 10, and outputs the processed signal. The output circuit 7 may perform only buffering, or may perform a black level adjustment, a column variation correction, various digital signal processing, or the like.

An input and output terminal 12 is provided for transmitting/receiving signals to/from the outside.

<Configuration Example of Solid-state Image Sensing Element Package>

Figure 2:
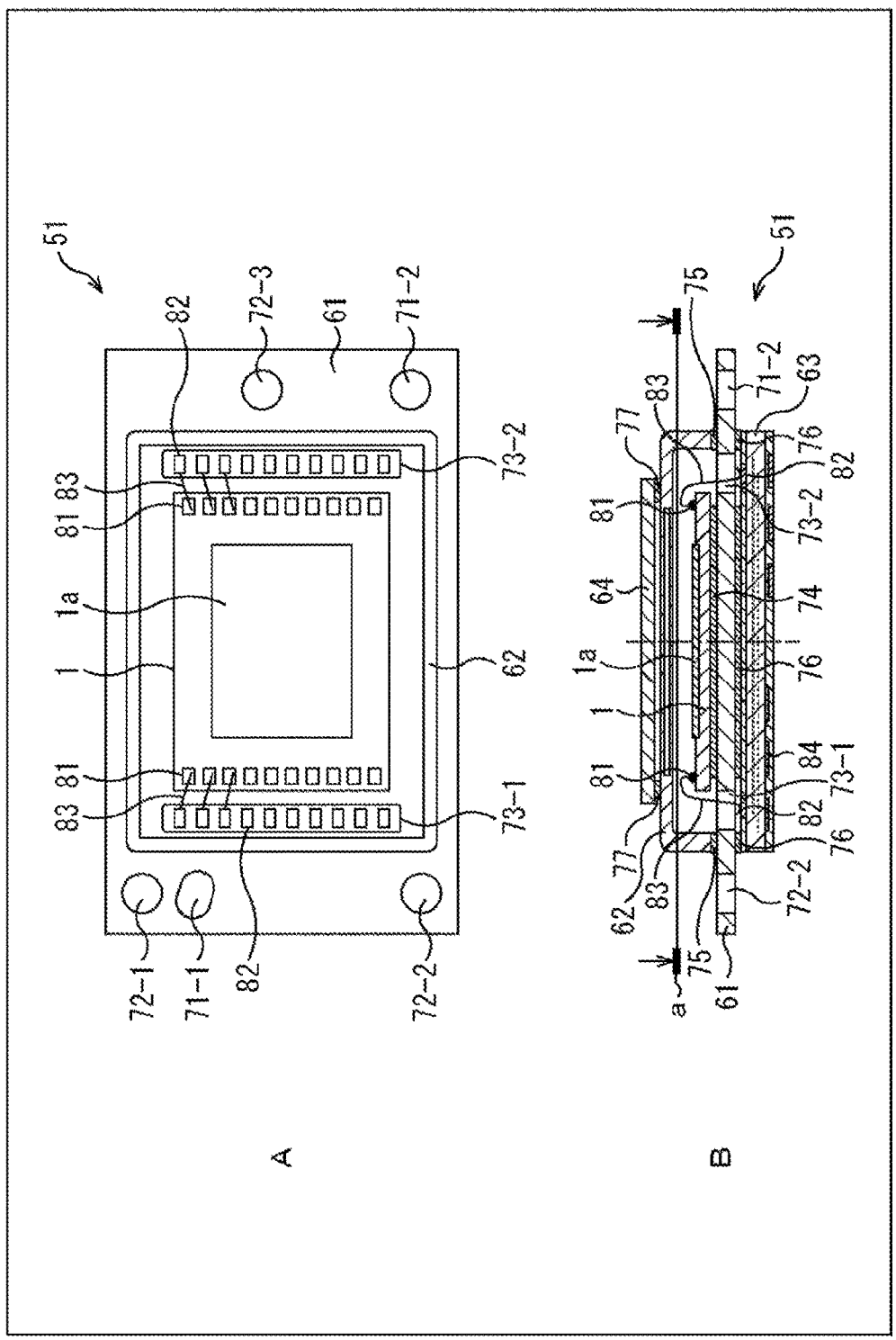
FIG. 2 is a diagram showing a first embodiment of a configuration of the solid-state image sensing element package to which the present technology is applied.

FIG. 2 is a diagram showing a configuration example of the solid-state image sensing element package to which the present technology is applied. A of FIG. 2 is a plan view of the solid-state image sensing element package, and B of FIG. 2 is a cross-sectional view of the solid-state image sensing element package. A of FIG. 2 is a plan view of B of FIG. 2 cut on a plane "a". B of FIG. 2 is a cross-sectional view of A of FIG. 2 cut on a plane roughly connecting a mounting hole 72-2 to a positioning hole 71-2, although the actual positions of parts on a heat dissipation plate 61 are more or less different.

Figure 3:
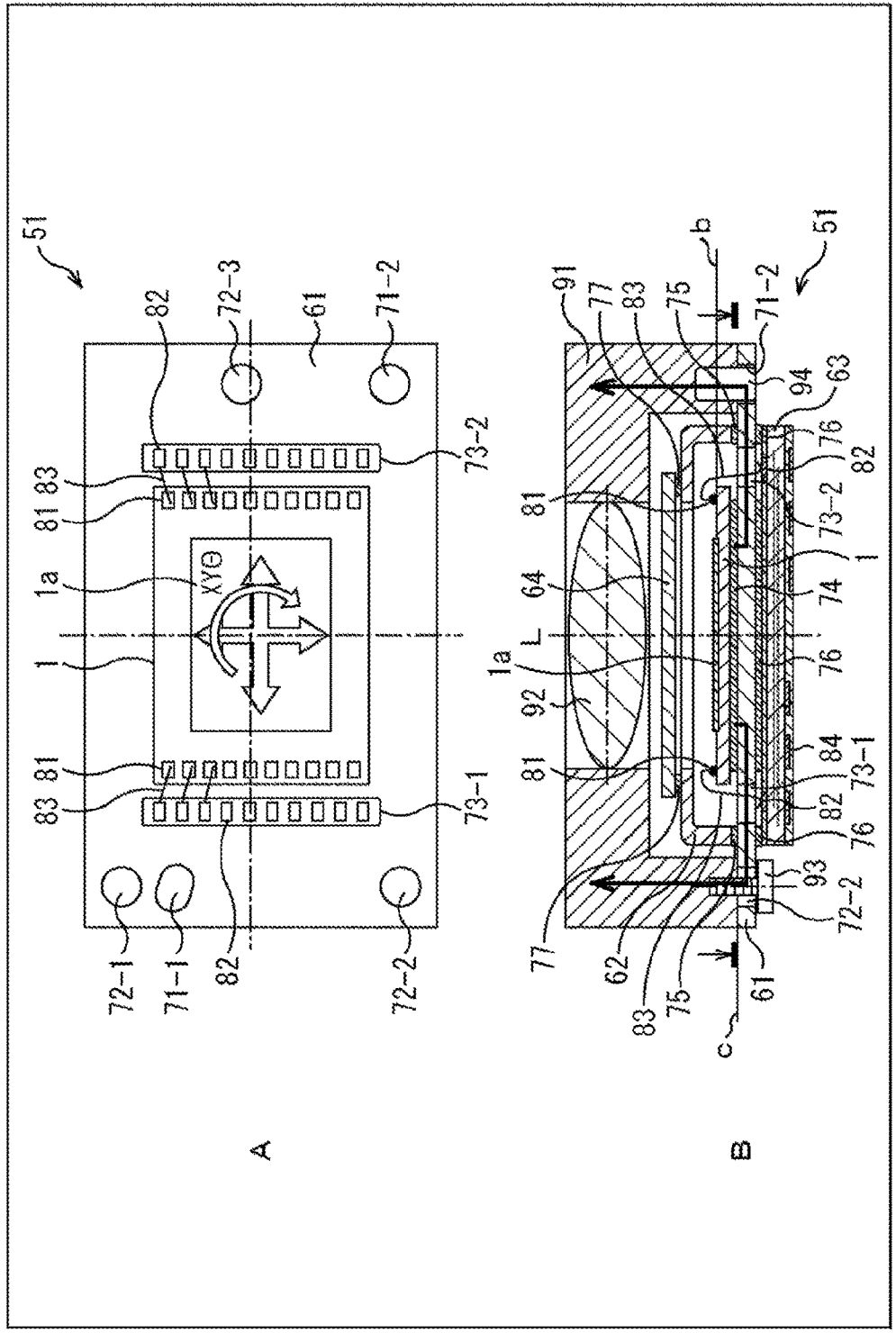
FIG. 3 is a diagram showing a mounting example of the solid-state image sensing element package.

In a solid-state image sensing element package 51, the image sensing element chip 1 is bonded and fixed to the heat dissipation plate 61 with a die bond material 74. The heat dissipation plate 61 has positioning holes 71-1 and 71-2 and mounting holes 72-1 to 72-3 for accurately mounting on a lens barrel unit 91 (FIG. 3). Here, the package refers that a solid-state image sensing element chip such as an image sensor is housed in ceramics.

The positioning holes 71-1 and 71-2 are for determining the position of the image sensing element chip 1 mounted on the lens barrel unit 91 (FIG. 3). The positioning hole 71-1 is formed directly under the mounting hole 72-1 at the top left corner of the heat dissipation plate 61. The positioning hole 71-2 is formed at the bottom right corner of the heat dissipation plate 61.

The mounting holes 72-1 to 72-3 are for mounting the image sensing element chip 1 on the lens barrel unit 91 (FIG. 3). The mounting hole 72-1 is formed at the top left corner of the heat dissipation plate 61. The mounting hole 72-2 is formed at the bottom left corner of the heat dissipation plate 61. The mounting hole 72-3 is formed at the center of the right end of the heat dissipation plate 61.

Note that the shape of each of the positioning holes 71-2 and the mounting holes 72-1 to 72-3 is an almost perfect circle. Meanwhile, the shape of the positioning hole 71-1 is an ellipse for determining pitch accuracy.

In addition, a circuit board 63 on which a circuit is formed is bonded to a bottom surface of the heat dissipation plate 61 with circuit board adhesive resin 76. It should be noted that the circuit board 63 may be just fixed (arranged), and may not be bonded. Bonding pads 81 that are electrodes of the image sensing element chip 1 are electrically connected to lead terminals 82 that are electrodes of the circuit board 63 by conduction wires 83 through conduction wire connection clearance holes 73-1 and 73-2 formed through the heat dissipation plate 61.

For example, the heat dissipation plate 61 is formed of a metal material that is high in thermal conductivity, high in deformation resistance, and high in stiffness, through which the positioning holes 71-1 and 71-2 are formed easily with high accuracy.

The image sensing element chip 1 generates a charge corresponding to the amount of light received on a light receiving surface by photoelectric conversion, and outputs the charge as an electric signal. Examples of the image sensing element chip 1 include CMOS (Complementary Metal Oxide Semiconductor) and CCD (Charge Coupled Device) sensors.

In the example shown in FIG. 2, the light receiving surface 1a is at the upper side, and the generated electric signal is output from the bonding pads 81 formed on the image sensing element chip 1, and is output to the outside of the solid-state image sensing element package 51 from an external terminal 84 of the circuit board 63 by the conduction wires 83 via the lead terminals 82 of the circuit board 63.

In the structure of the solid-state image sensing element package 51, a cap 62 is bonded to the heat dissipation plate 61 with cap bonding resin 75, and further, a cover glass 64 is bonded to the cap 62 with glass adhesive resin 77 in order to protect the image sensing element chip 1 and the conduction wires 83 from the external environment including water, humidity, and an external force. Thus, the solid-state image sensing element package 51 has an enclosed structure with the cap 62 and the cover glass 64 bonded.

FIG. 3 is a diagram showing the state that the solid-state image sensing element package is mounted on the lens barrel unit that is one of the units constituting the image sensing apparatus. A of FIG. 3 is a plan view of the solid-state image sensing element package, and B of FIG. 3 is a cross-sectional view of the solid-state image sensing element package. The relationship between A of FIG. 3 and B of FIG. 3 is almost same as that between A of FIG. 2 and B of FIG. 2. However, in A of FIG. 3, the cap 62 is not shown. In addition, although only a positioning pin 94 for the positioning hole 71-2 is shown in the embodiment shown in B of FIG. 3, the positioning pin 94 for the positioning hole 71-1 is also provided. Similarly, although only a mount screw 93 for the mounting hole 72-2 is shown, the mount screws 93 for the mounting hole 72-1 and 72-3 are also provided.

The solid-state image sensing element package 51 has the structure that the heat dissipation plate 61 is fixed to the lens barrel unit 91 including a lens 92 with the mount screw 93 for the mounting hole 72-2. According to this structure, heat generated by the image sensing element chip 1 is effectively dissipated externally from the heat dissipation plate 61 having high thermal conductivity directly through the mechanism constituting the image sensing apparatus such as the lens barrel unit 91 via the heat dissipation paths shown by the bold arrows.

In the solid-state image sensing element package 51, the image sensing element chip 1 is bonded to the heat dissipation plate 61, where the accuracy of $XY\theta$ of the image sensing element chip 1 in relation to the positioning hole 71-1 of the heat dissipation plate 61 is high. Also, the image sensing element chip 1 is accurately bonded to the heat dissipation plate 61, while tilt of an image sensing plane b to a mount plane c is compensated.

In the lens barrel unit 91, an optical axis L of the lens 92 is accurately positioned with respect to the positioning pin 94 through the positioning hole 71-2 and the mount plane c of the lens barrel unit 91.

The solid-state image sensing element package 51 is guided by the positioning pins 94 through the positioning holes 71-1 and 71-2 of the heat dissipation plate 61, and is fixed to the lens barrel unit 91 with the mount screws 93 through the mounting holes 72-1 to 72-3. As a result, a highly accurate positional relationship between the image sensing element chip 1 and the lens 92 can be easily obtained without adjusting the optical axis.

<Production Processing Example of Solid-state Image Sensing Element Package>

Figure 4:
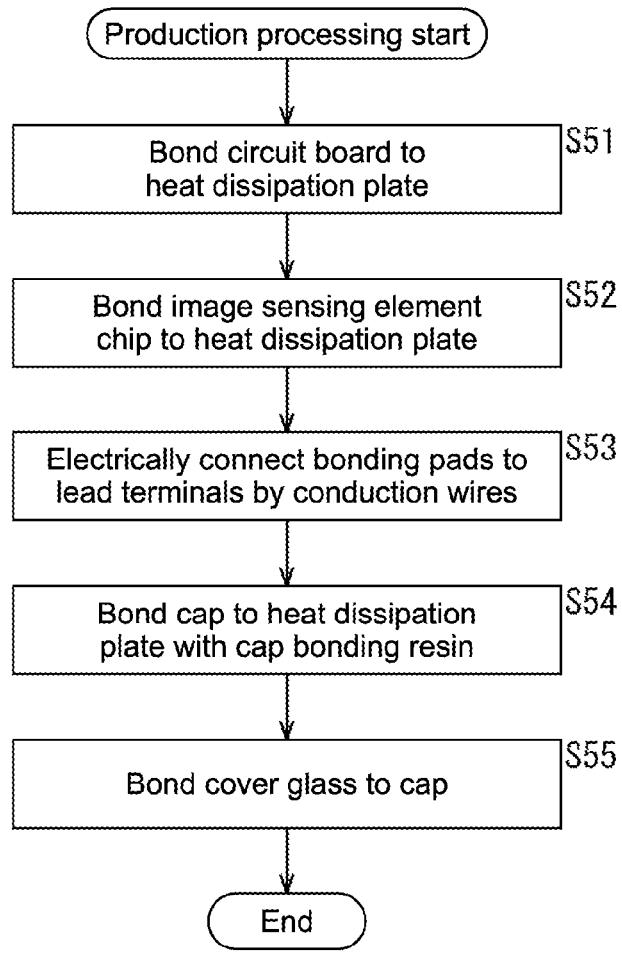
FIG. 4 is a flowchart for explaining production processing of the solid-state image sensing element package of FIG. 2.

Next, with reference to the flowchart of FIG. 4, the production processing of the solid-state image sensing element package 51 of FIG. 2 will be described. It should be noted that this processing is executed by a production apparatus (not shown), and is described with reference to the process charts of FIGS. 5 to 7, as appropriate.

Figure 5:
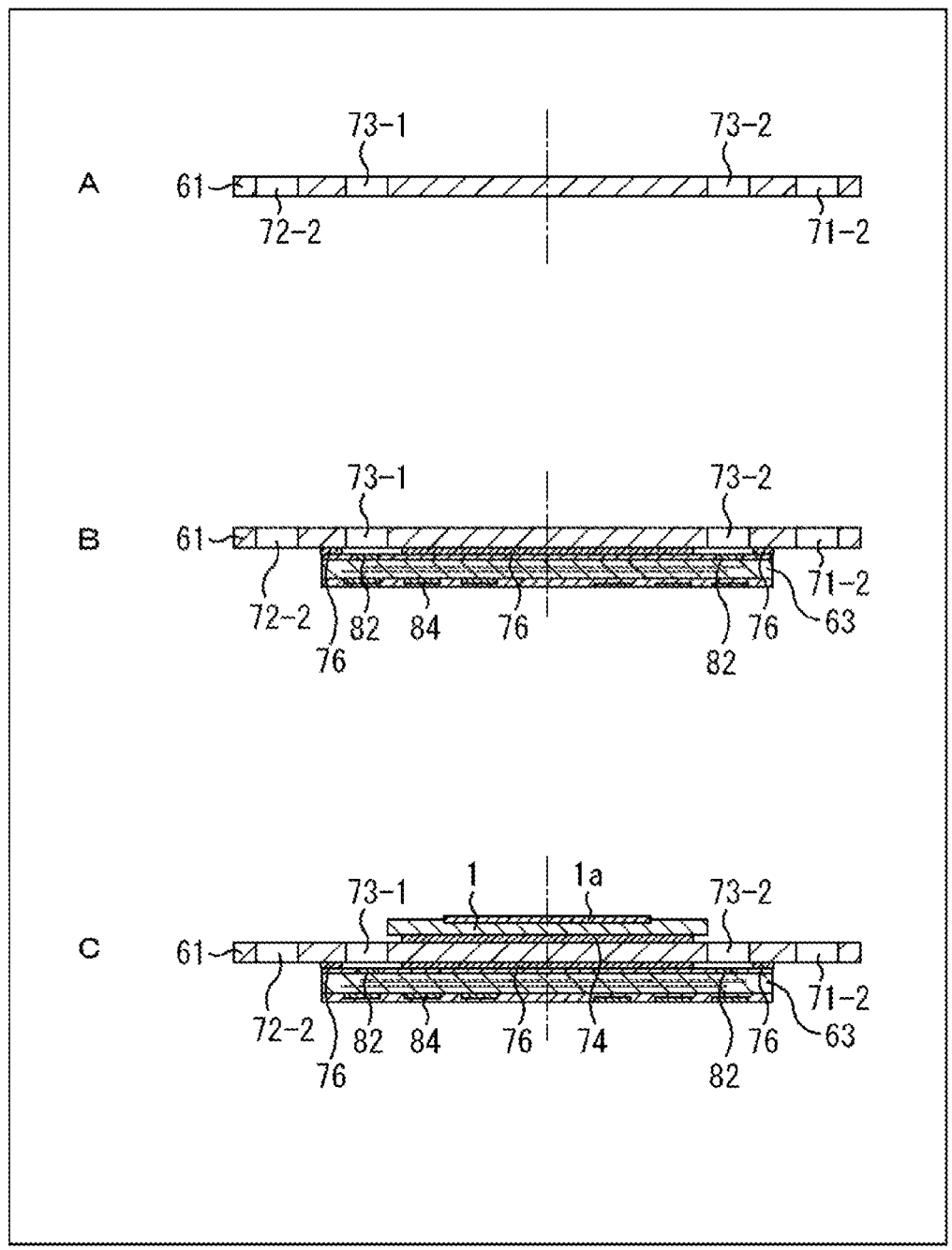
FIG. 5 is a process chart showing the production processing of the solid-state image sensing element package.

First, as shown in A of FIG. 5, the heat dissipation plate 61, through which the positioning holes 71-1 and 71-2, the mounting holes 72-1 to 72-3, and the conduction wire connection clearance holes 73-1 and 73-2 are formed, is prepared.

In Step S51, as shown in B of FIG. 5, the production apparatus bonds the circuit board 63, on which the lead terminals 82 and the external terminal 84 are formed, to the heat dissipation plate 61 with the circuit board adhesive resin 76. It should be noted that the circuit board 63 may be fixed (arranged), and may not be bonded.

In Step S52, as shown in C of FIG. 5, the production apparatus bonds the image sensing element chip 1 to the heat dissipation plate 61 with the die bond material 74 with the light receiving surface 1a facing up.

Figure 6:
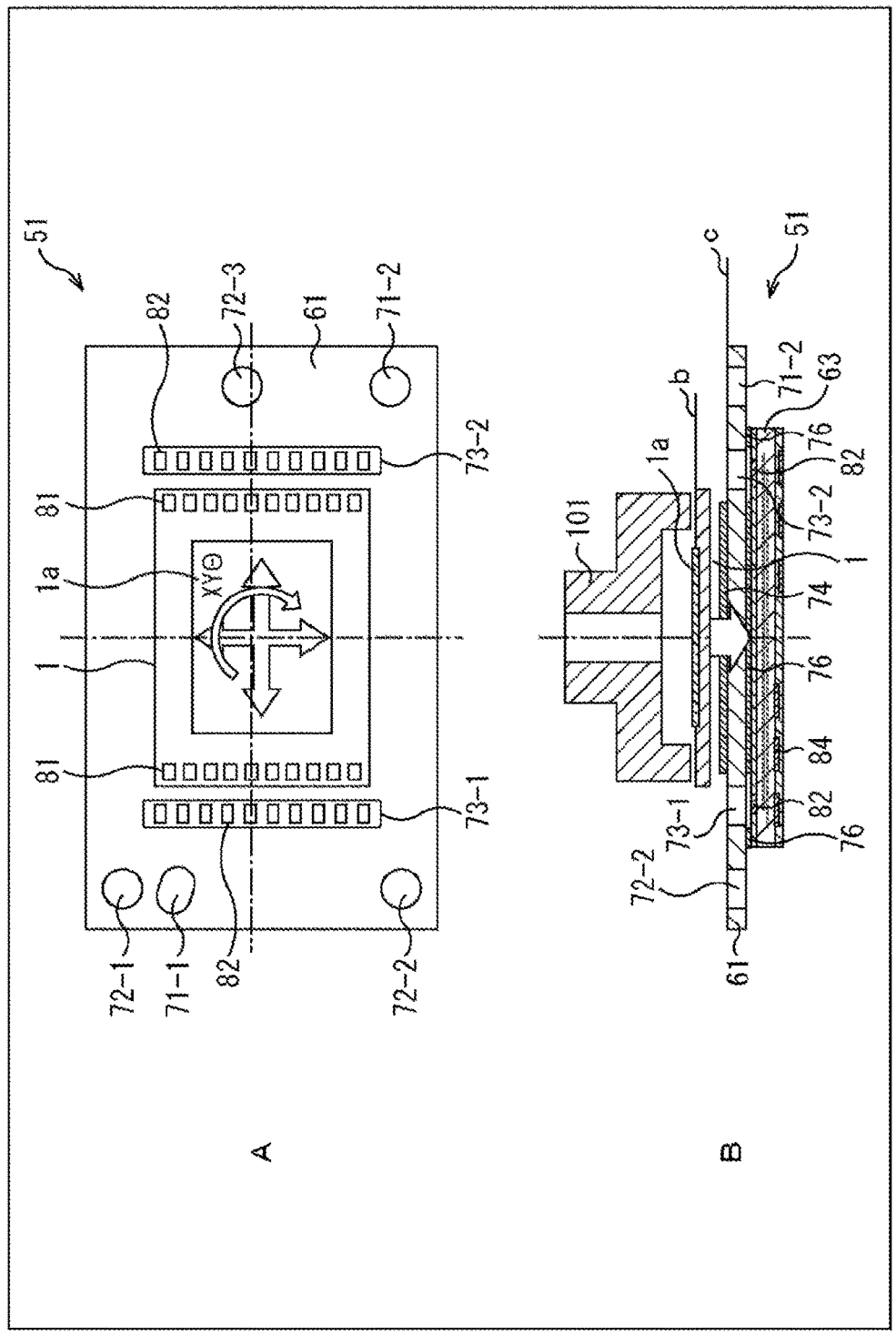
FIG. 6 is a diagram for explaining a bonding method of the solid-state image sensing element chip.

Specifically, as shown in FIG. 6, the image sensing element chip 1 is suction-handled by a chip suction collet 101 of the production apparatus, and is bonded to the heat dissipation plate 61 with the die bond material 74.

At this time, the image sensing element chip 1 is bonded accurately in the $xy\theta$ directions in alignment with the positioning holes 71-1 and 71-2 of the heat dissipation plate 61. In addition, the image sensing element chip 1 is accurately bonded and fixed while the tilt of the image sensing plane b is corrected with respect to the mount plane c as a reference.

Figure 7:
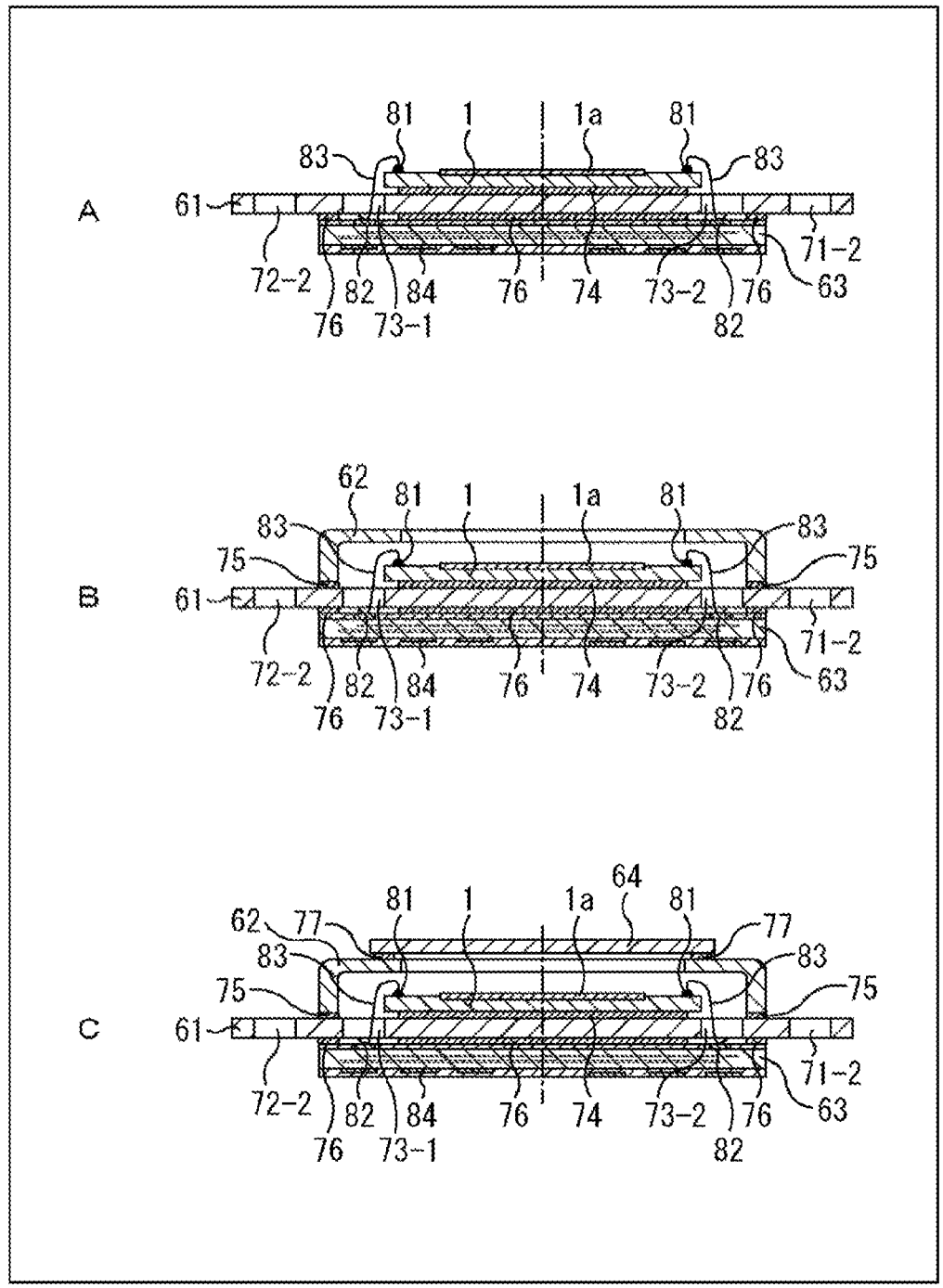
FIG. 7 is a process chart showing the production processing of the solid-state image sensing element package.

In Step S53, as shown in A of FIG. 7, the production apparatus electrically connects the bonding pads 81 formed on the image sensing element chip 1 to the lead terminals 82 formed on the circuit board 63 by the conduction wires 83. This processing is performed through the conduction wire connection clearance holes 73-1 and 73-2 formed through the heat dissipation plate 61.

In Step S54, as shown in B of FIG. 7, the production apparatus bonds the cap 62 to the heat dissipation plate 61 with cap bonding resin 75 in order to protect the image sensing element chip 1.

In Step S55, as shown in C of FIG. 7, the production apparatus mounts the cover glass 64 on the cap 62 using the glass adhesive resin 77 in order to protect the image sensing element chip 1 and to ensure the optical path.

Thus, the solid-state image sensing element package 51 is produced where the image sensing element chip 1 is accurately mounted with respect to the lens 92 of the lens barrel unit 91.

<Configuration Example of Solid-state Image Sensing Element Package>

Figure 8:
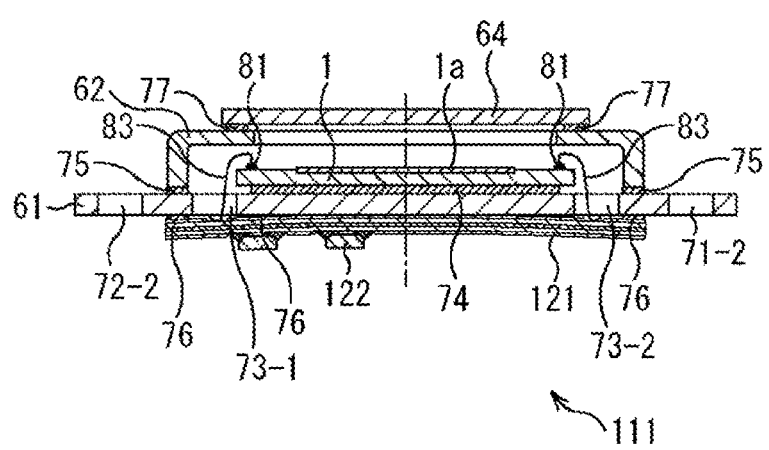
FIG. 8 is a diagram showing a second embodiment of a configuration of the solid-state image sensing element package to which the present technology is applied.

FIG. 8 is a cross-sectional view showing another configuration example of the solid-state image sensing element package to which the present technology is applied.

The solid-state image sensing element package 111 shown in FIG. 8 is common to the solid-state image sensing element package 51 in FIG. 2 in that the image sensing element chip 1 is fixed to the heat dissipation plate 61 having the positioning holes 71-1 and 71-2, the mounting holes 72-1 to 72-3, and the conduction wire connection clearance holes 73-1 and 73-2 with the die bond material 74.

The solid-state image sensing element package 111 in FIG. 8 is common to the solid-state image sensing element package 51 in FIG. 2 in that the cap 62 is bonded to the heat dissipation plate 61 with the cap bonding resin 75, and further, the cover glass 64 is bonded to the cap 62 with the glass adhesive resin 77.

However, the solid-state image sensing element package 111 of FIG. 8 is different from the solid-state image sensing element package 51 of FIG. 2 in that the circuit board 63 fixed to the bottom surface of the heat dissipation plate 61 with the circuit board adhesive resin 76 is replaced with the circuit board 121, and in that electric parts 122 are provided on the circuit board 121.

In other words, the circuit board 121 is formed of an organic board or a flexible board, each of which is inexpensive and low in stiffness. It should be noted that it is the same that terminals (not shown) provided on the circuit board 121 are electrically connected to the bonding pads 81 that are electrodes of the image sensing element chip 1 by the conduction wires 83 through the conduction wire connection clearance holes 73-1 and 73-2 formed through the heat dissipation plate 61.

In general, the image sensing element chip is bonded to the circuit board, and the circuit board is formed of a material such as ceramics having high stiffness and resistance to environmental changes, e.g., moisture resistance, in order to ensure and keep the positional accuracy of the image sensing element chip.

In contrast, according to the present technology, since the image sensing element chip 1 is bonded and fixed to the heat dissipation plate 61 having high stiffness, the circuit board 121 is not especially limited to ceramics or an organic board having high stiffness, and may be formed of an organic board or a flexible board, each of which is inexpensive and low in stiffness. Furthermore, in a case that the electric parts 122 are mounted on the circuit board 121 and the circuit board 121 is deformed, the positional accuracy of the image sensing element chip 1 is kept.

Thus, the circuit structure according to the present technology is suitable to be modularized where the peripheral electric circuit is built into the image sensing element chip.

As described above, in a case that an electronic device including a solid-state image sensing element package captures an image, the image sensing element chip generates heat, and thereby the electric properties may be degraded and the image quality may be degraded. Therefore it is desirable to provide a solid-state image sensing element package having high heat dissipation properties.

In view of the above, Patent Literature 1 discloses a package structure including a metal plate and a frame that can effectively dissipate heat of an image sensing element from the metal plate to a camera lens housing and the like. However, in recent years, the number of pixels and the processing speed of a solid-state image sensing element are increased, and the amount of heat generated by an image sensing element chip is also increased. Therefore, it is desirable to provide a more effective heat dissipation structure.

In addition, as people pursue higher image quality, it is desirable to provide an image sensing element chip having a higher positional accuracy with respect to the lens.

In the package structure having a metal plate and a frame disclosed in Patent Literature 1, a board having great thermal resistance and a frame formed of resin are present in a heat dissipation path of the image sensing element chip. It is difficult to sufficiently dissipate the heat with this structure. In addition, the positional accuracy of the image sensing element chip with respect to the lens is insufficient because the positional accuracy is impaired, affected by shrinkage of the metal plate and the resin frame in shape forming processes, the presence of resin for bonding the frame, and the like.

In contrast, according to the present technology, the heat dissipation plate is provided between the image sensing element chip and the board.

This allows the heat generated by the image sensing element chip to be effectively dissipated.

The image sensing element chip may be easily and efficiently mounted on the lens barrel unit constituting the image sensing apparatus such as a camera.

The material of the circuit board is not limited to a material having high stiffness and being resistant to environmental changes, e.g., moisture resistance. Instead, the circuit board may be formed of an organic board or a flexible board, each of which is inexpensive and low in stiffness.

Furthermore, the structure is suitable to be modularized where the peripheral electric circuit is built into the image sensing element chip, e.g., the parts are mounted on the circuit board. It should be noted that a modularized product, in which the peripheral electric circuit is built into the image sensing element (sensor), may also be referred to as a sensor module.

It should be noted that the present technology is applied to the CMOS solid-state image sensing element in the above description, and may also be applied to the solid-state image sensing element such as a CCD (Charge Coupled Device) solid-state image sensing element.

In addition, the solid-state image sensing element may be a backside irradiation type solid-state image sensing element or a surface irradiation type solid-state image sensing element.

It should be noted that the present technology is applicable not only to the solid-state image sensing element but also to the image sensing apparatus. Here, the image sensing apparatus means a camera system such as a digital still camera and a digital video camera, and an electronic device having an image sensing function such as a mobile phone. It should be noted that the image sensing apparatus may be a module form to be mounted on an electronic device, i.e., a sensor module or a camera module.

<Configuration Example of Electronic Device>

Figure 9:
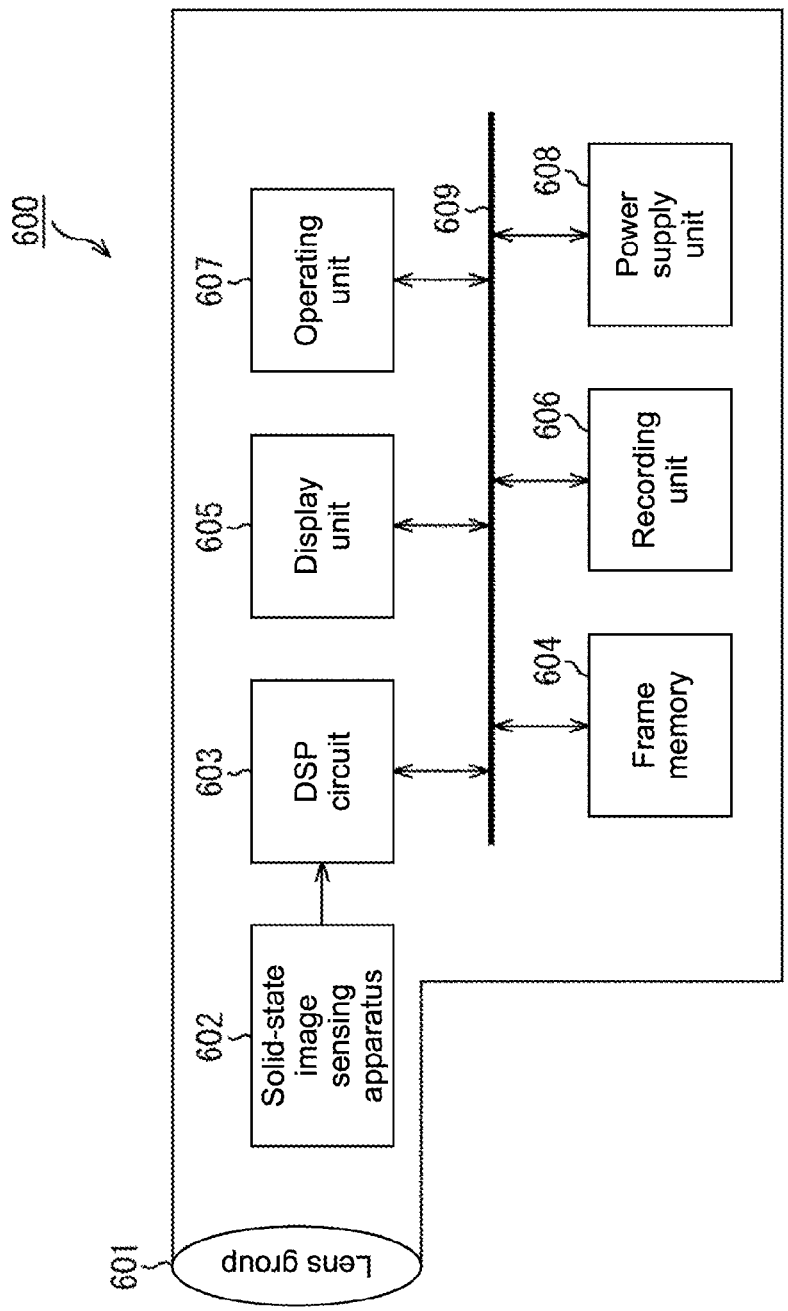
FIG. 9 is a block diagram showing a configuration example of an electronic device to which the present technology is applied.

FIG. 9 is a block diagram showing a configuration example of a camera device as an electronic device to which the present technology is applied.

A camera device 600 of FIG. 9 includes an optical unit 601 having a lens group and the like, a solid-state image sensing element (image sensing device) 602 having each structure of the present technology, and a DSP circuit 603 that is a camera signal processing circuit. In addition, the camera apparatus 600 includes a frame memory 604, a display unit 605, a recording unit 606, an operating unit 607, and a power supply unit 608. The DSP circuit 603, the frame memory 604, the display unit 605, the recording unit 606, the operating unit 607, and the power supply unit 608 are mutually connected via a bus line 609.

The optical unit 601 gathers incident light (image light) from an object and forms an image on the imaging surface of the solid-state imaging element 602. The solid-state imaging element 602 converts the amount of the incident light, which has been gathered as the image on the imaging surface by the optical unit 601, into an electrical signal for each pixel, and outputs the electrical signal as a pixel signal. The solid-state imaging element package according to any of the above described embodiments can be used as the solid-state imaging device 602.

The display unit 605 is formed of a panel display device such as a liquid crystal panel or an organic electro-luminescence (EL) panel, and displays a moving image or a still image formed by the solid-state imaging device 602. The recording unit 606 records a moving image or a still image formed by the solid-state imaging device 602 on a recording medium such as a video tape and a digital versatile disk (DVD).

Operated by a user, the operating unit 607 issues operating instructions as to various functions of the camera apparatus 600. The power supply unit 608 supplies various power sources as the operation power sources to the DSP circuit 603, the frame memory 604, the display unit 605, the recording unit 606, and the operating unit 607, as appropriate.

The present technology is applicable not only to solid-state image sensing elements but also to semiconductor elements which needs no photodiode or the like. In that case, it is possible to accurately mount the semiconductor element not on a camera configuration unit, e.g., the lens barrel unit, but on a unit of a semiconductor apparatus (device), for example.

It should be noted that, in the present specification, the steps for illustrating the series of processes described above include not only processes that are performed in time series in the described order, but also processes that are executed in parallel or individually, without being necessarily processed in time series.

Further, the embodiments of the present disclosure are not limited to the embodiments described above and various modifications can be made without departing from the gist of the present disclosure.

In addition, the respective steps described with reference to the above-described flowchart can be not only executed by one device, but also executed in cooperation by a plurality of devices.

Further, where one step includes a plurality of processes, the plurality of processes included in one step can be not only executed by one device, but also executed in cooperation by a plurality of devices.

Further, the configuration described above as one device (or processing unit) may be divided into a plurality of devices (or processing units). Vice versa, the configuration described above as a plurality of devices (or processing units) may be combined into one device (or processing unit Further, it should be understood that a configuration other than the configuration described above may be added to the configuration of each device (or each processing unit). Further, where a configuration or an operation of an entire system is substantially the same, a part of the configuration of any device (or processing unit) may be included in a configuration of another device (or another processing unit). In other words, the present technology is not limited to the embodiments described above and various changes can be made without departing from the gist of the present technology.

While the preferred embodiments of the present disclosure have been described in detail with reference to the accompanying drawings, the disclosure is not limited to such examples. It is apparent that various variations or modifications can be conceived by those skilled in the art in the gist of technical ideas of the claims, and it is understood that the variations or modifications are within to the technical scope of the present disclosure.

The present technology may also have the following configurations.

(1) A semiconductor package, including:
 a heat dissipation plate;
 a semiconductor element chip bonded to a top surface of the heat dissipation plate; and
 a circuit board arranged on a bottom surface of the heat dissipation plate,
 an electrode of the semiconductor element chip being connected to an electrode of the circuit board by a conduction wire through a hole formed through the heat dissipation plate.

(2) The semiconductor package according to (1), in which
 a mounting hole for mounting on a configuration unit that configures a semiconductor apparatus and a positioning hole for determining a position on the configuration unit are formed through the heat dissipation plate.

(3) The semiconductor package according to (2), in which
 the semiconductor element chip is a solid-state image sensing element chip, and
 the configuration unit is a configuration unit that configures an image sensing apparatus.

(4) The semiconductor package according to (3), in which
 the configuration unit is a lens barrel unit.

(5) The semiconductor package according to any of (1) to (4), in which
 the circuit board is an organic board or a flexible board each having low stiffness.

(6) The semiconductor package according to any of (1) to (5), in which
 the circuit board is bonded to the bottom surface of the heat dissipation plate.

(7) The semiconductor package according to any of (1) to (6), in which
 the heat dissipation plate is metal.

(8) A sensor module, including:
  a heat dissipation plate;
  a semiconductor element chip bonded to a top surface of the heat dissipation plate; and
  a circuit board arranged on a bottom surface of the heat dissipation plate,
  an electrode of the semiconductor element chip being connected to an electrode of the circuit board by a conduction wire through a hole formed through the heat dissipation plate.
(9) The sensor module according to (8), in which
  a mounting hole for mounting on a configuration unit that configures a semiconductor apparatus and a positioning hole for determining a position on the configuration unit are formed through the heat dissipation plate.
(10) The sensor module according to (9), in which
  the semiconductor element chip is a solid-state image sensing element chip, and
  the configuration unit is a configuration unit that configures an image sensing apparatus.
(11) The sensor module according to (10), in which
  the configuration unit is a lens barrel unit.
(12) The sensor module according to any of (8) to (11), in which
  the circuit board is an organic board or a flexible board each having low stiffness.
(13) The sensor module according to any of (8) to (12), in which
  the circuit board is bonded to the bottom surface of the heat dissipation plate.
(14) The sensor module according to any of (8) to (13), in which
  the heat dissipation plate is metal.
(15) A production method, including:
  arranging a circuit board on a bottom surface of a heat dissipation plate;
  bonding a semiconductor element to a top surface of the heat dissipation plate; and
  connecting an electrode of a chip of the semiconductor element to an electrode of the circuit board by a conduction wire through a hole formed through the heat dissipation plate.

REFERENCE SIGNS LIST 1 image sensing element chip
1a light receiving surface
51 solid-state image sensing element package
61 heat dissipation plate
71-1, 71-2 positioning hole
72-1 to 72-3 mounting hole
73-1, 73-2 conduction wire connection clearance hole
74 die bond material
75 cap bonding resin
76 circuit board adhesive resin
77 glass adhesive resin
81 bonding pad
82 lead terminal
83 conduction wire
91 lens barrel
92 lens
111 solid-state image sensing element package
121 circuit board
600 camera apparatus
601 optical unit
602 solid-state image sensing element
603 DSP circuit

The invention claimed is:

1. A semiconductor package, comprising:
  a planar heat dissipation plate;
  a first surface of a semiconductor element chip bonded to a top surface of the planar heat dissipation plate;
  a circuit board arranged on a bottom surface of the planar heat dissipation plate;
  a plurality of conduction wires, each conduction wire of the plurality of conduction wires electrically connecting an electrode of the semiconductor element chip located at a second surface of the semiconductor element chip to an electrode of the circuit board through a hole formed through the planar heat dissipation plate; and
  an enclosed structured including a cap bonded to the planar heat dissipation plate and a cover glass bonded to the cap, wherein the enclosed structure forms an enclosure around the semiconductor element chip and the plurality of conduction wires.

2. The semiconductor package according to claim 1, wherein a mounting hole for mounting on a configuration unit that configures a semiconductor apparatus and a positioning hole for determining a position on the configuration unit are formed through the planar heat dissipation plate.

3. The semiconductor package according to claim 2, wherein the semiconductor element chip is a solid-state image sensing element chip, and the configuration unit is a configuration unit that configures an image sensing apparatus.

4. The semiconductor package according to claim 3, wherein the configuration unit is a lens barrel unit.

5. The semiconductor package according to claim 1, wherein the circuit board is an organic board or a flexible board.

6. The semiconductor package according to claim 1, wherein the circuit board is bonded to the bottom surface of the planar heat dissipation plate.

7. The semiconductor package according to claim 1, wherein the planar heat dissipation plate is metal.

8. A sensor module, comprising:
  a planar heat dissipation plate;
  a first surface of a semiconductor element chip bonded to a top surface of the planar heat dissipation plate;
  a circuit board arranged on a bottom surface of the planar heat dissipation plate;
  a plurality of conduction wires, each conduction wire of the plurality of conduction wires electrically connecting an electrode of the semiconductor element chip located at a second surface of the semiconductor element chip to an electrode of the circuit board through a hole formed through the planar heat dissipation plate; and
  an enclosed structure including a cap bonded to the planar heat dissipation plate and a cover glass bonded to the cap, wherein the enclosed structure forms an enclosure around the semiconductor element chip and the plurality of conduction wires.

9. The sensor module according to claim 8, wherein a mounting hole for mounting on a configuration unit that configures a semiconductor apparatus and a positioning hole for determining a position on the configuration unit are formed through the planar heat dissipation plate.

10. The sensor module according to claim 9, wherein the semiconductor element chip is a solid-state image sensing element chip, and the configuration unit is a configuration unit that configures an image sensing apparatus.

11. The sensor module according to claim 10, wherein the configuration unit is a lens barrel unit.

12. The sensor module according to claim 8, wherein the circuit board is an organic board or a flexible board.

13. The sensor module according to claim 8, wherein the circuit board is bonded to the bottom surface of the planar heat dissipation plate.

14. The sensor module according to claim 8, wherein the planar heat dissipation plate is metal.

15. A production method, comprising:
- arranging a circuit board on a bottom surface of a planar heat dissipation plate;
- bonding a first surface of a semiconductor element to a top surface of the planar heat dissipation plate;
- connecting a plurality of electrodes located at a second surface of the semiconductor element to a plurality of electrodes of the circuit board with a plurality of conduction wires, wherein the plurality of conduction wires pass through a plurality of holes formed through the planar heat dissipation plate;
- bonding a cap to the planar heat dissipation plate with a cap bonding resin; and
- adhering a cover glass to the cap using an adhesive resin, wherein an enclosed structure including the cap and the cover glass encloses the semiconductor element and the plurality of conduction wires.

16. The semiconductor package according to claim 1, further comprising:
a lens disposed above the cover glass.

* * * * *